US011387169B2

United States Patent
Khalil et al.

(10) Patent No.: US 11,387,169 B2
(45) Date of Patent: Jul. 12, 2022

(54) TRANSISTOR WITH I/O PORTS IN AN ACTIVE AREA OF THE TRANSISTOR

(71) Applicant: NXP USA, Inc., Austin, TX (US)

(72) Inventors: Ibrahim Khalil, Gilbert, AZ (US); Kevin Kim, Gilbert, AZ (US); Humayun Kabir, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/984,286

(22) Filed: Aug. 4, 2020

(65) Prior Publication Data

US 2022/0044986 A1     Feb. 10, 2022

(51) Int. Cl.
    *H01L 23/482*     (2006.01)
    *H01L 23/48*     (2006.01)
    *H01L 23/00*     (2006.01)

(52) U.S. Cl.
    CPC ........ *H01L 23/4824* (2013.01); *H01L 23/481* (2013.01); *H01L 24/06* (2013.01); *H01L 2224/06136* (2013.01)

(58) Field of Classification Search
    CPC ... H01L 23/4824; H01L 24/06; H01L 23/481; H01L 2224/06136
    See application file for complete search history.

(56) References Cited

U.S. PATENT DOCUMENTS

| | | |
|---|---|---|
| 7,166,898 B2 | 1/2007 | Briere |
| 7,290,864 B2 | 11/2007 | King |
| 9,064,947 B2 | 6/2015 | Roberts et al. |
| 9,727,254 B2 | 8/2017 | Jeon |
| 9,800,209 B2 | 10/2017 | Li |
| 9,960,145 B2 | 5/2018 | Costa et al. |
| 10,075,132 B2 | 9/2018 | Jones et al. |
| 10,594,276 B2 | 3/2020 | Jones et al. |
| 10,734,303 B2 | 8/2020 | Odnoblyudov |
| 2002/0185675 A1 | 12/2002 | Furukawa |
| 2004/0245638 A1 | 12/2004 | Nemtsev et al. |
| 2010/0109052 A1 | 5/2010 | Nakajima et al. |
| 2012/0012945 A1 | 1/2012 | Inoue |
| 2014/0070881 A1 | 3/2014 | Annes et al. |

(Continued)

FOREIGN PATENT DOCUMENTS

EP     3428971 A1     1/2019

OTHER PUBLICATIONS

U.S. Appl. No. 17/007,175; not yet published; 45 pages, filed Aug. 31, 2020.

(Continued)

*Primary Examiner* — Jonathan Han

(57) ABSTRACT

A semiconductor device includes an active region formed in a substrate. The active region includes input fingers, output fingers, and common fingers disposed within the substrate and oriented substantially parallel to one another. An input port is electrically connected to the input fingers and an output port is electrically connected to the output fingers. A common region is electrically connected to the common fingers. At least one of the input and output ports is positioned within the active region between the input, output, and common fingers. The common region is interposed between a pair of the common fingers such that the common fingers of the pair are spaced apart by a gap, and at least one of the input and output ports is position in the gap.

24 Claims, 5 Drawing Sheets

(56) References Cited

U.S. PATENT DOCUMENTS

| | | | |
|---|---|---|---|
| 2017/0077051 A1 | 3/2017 | Sanders et al. | |
| 2018/0226506 A1 | 8/2018 | Chang et al. | |
| 2020/0118922 A1* | 4/2020 | Hill | H01L 23/5226 |
| 2021/0002137 A1 | 1/2021 | Schultz et al. | |
| 2021/0202408 A1* | 7/2021 | Khalil | H01L 24/49 |
| 2021/0265473 A1* | 8/2021 | Yamaguchi | H01L 29/812 |
| 2021/0313293 A1* | 10/2021 | Noori | H01L 23/66 |

OTHER PUBLICATIONS

U.S. Appl. No. 17/068,051; not yet published; 44 pages, filed Oct. 12, 2020.

U.S. Appl. No. 17/205,390; not yet published; 68 pages, filed Mar. 18, 2021.

Hill, Darrell et al.; "28-V Low Thermal-Impedance HBT With 20-W CW Output Poser"; IEEE Transactions on Microwave Theory and Techniques, vol. 45, No. 12; 5 pages (Dec. 1997).

Hill, Darrell et al; "Three-Dimensional MMIC Architecture Using Low Thermal Impedance Technology"; IEEE MTT-S Digest; 4 pages (1998).

Xu, Jane; "GaN HEMTs based Flip-chip Integrated Broadband Power Amplifier"; University of California at Santa Barbara, ONR MURI Center Impact—Innovative Microwave Power Amplifier Consortium Center; retreived from the Internet https://my.ece.ucsb.edu/Mishra/ganitrideelec/xudefense.pdf; 72 pages (Dec. 2000).

Kuo, Che-Chjung et al; "A 3.5-GHz SiGe 0.35um HBT Flip-Chip Assembled on Ceramics Integrated Passive Device Doherty Power Amplifier for SiP Integration"; Proceedings of the Asia-Pacific Microwave Conference 2011; 4 pages (2011).

Non Final Office Action; U.S. Appl. No. 17/068,051; 8 pages (dated Mar. 11, 2022).

\* cited by examiner

PRIOR ART

TRANSISTOR WITH I/O PORTS IN AN ACTIVE AREA OF THE TRANSISTOR

TECHNICAL FIELD OF THE INVENTION

The present invention relates generally to semiconductor devices. More specifically, the present invention relates to a transistor layout utilizing input and output (I/O) ports located within an active area of the transistor and positioned between input, output, and common fingers.

BACKGROUND OF THE INVENTION

Transistor devices are utilized in a wide variety of electronic circuit applications. Field-Effect Transistor (FET) devices typically include a drain lead, a source lead, and a gate lead. A channel is disposed between the drain and source, and the channel is the portion of the FET device that conducts current when the FET device is turned on. The gate is the control input of the device which is utilized to control the current flow in the channel.

In various circuit applications, FET devices may be utilized as two-port active devices. In a two-port configuration, two of the three FET leads serve as the input and output ports, and the third FET lead is utilized as the common connection which is connected to the ground potential of the circuit. Depending upon the particular two-port configuration, any one of the three FET leads can be utilized as either the input port, output port, or common connection.

SUMMARY

Aspects of the disclosure are defined in the accompanying claims.

In a first aspect, there is provided a semiconductor device comprising: an active region formed in a substrate, the active region including input fingers, output fingers, and common fingers disposed within the substrate and oriented substantially parallel to one another; an input port electrically connected to the input fingers; an output port electrically connected to the output fingers; and a common region electrically connected to the common fingers, wherein at least one of the input and output ports is positioned within the active region between the input, output, and common fingers.

In a second aspect, there is provided a semiconductor device comprising: an active region formed in a substrate, the active region including input fingers, output fingers, and common fingers disposed within the substrate and oriented substantially parallel to one another; an input port electrically connected to the input fingers; an output port electrically connected to the output fingers; and a common region interposed between a pair of the common fingers, the common region being located at an intermediate region of each of the common fingers of the pair and the common region being electrically connected to each of the common fingers of the pair, wherein the common fingers are spaced apart by a first gap at a first side of the common region, the common fingers are spaced apart by a second gap at a second side of the common region, the input port is located in the first gap within the active region and the output port is located in the second gap within the active region, and the common region is electrically isolated from each of the first and second output ports.

In a third aspect, there is provided a semiconductor device comprising: an active region formed in a substrate, the active region including input fingers, output fingers, and common fingers disposed within the substrate and oriented substantially parallel to one another; an input bond pad electrically connected to the input fingers; an output bond electrically connected to the output fingers; and a common region electrically connected to the common fingers, the common region including a via connection that extends through the substrate and connects to a common node of the semiconductor device, wherein at least one of the input and output bond pads is positioned within the active region between a pair of the common fingers, and each of the input and output bond pads is configured for wire bonding.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, embodiments disclosed herein entail semiconductor devices, and more specifically, a layout for a transistor device in which input and/or output ports, along with source connections, are located within an active area of the transistor device and are positioned between input, output, and common fingers of the transistor device. The transistor layout enables the effective utilization of gaps between the transistor fingers to create the input and/or output ports for the transistor device. The input and/or output ports may include bond pads for wire bonding or solder bumps for flip-chip bonding. Accordingly, such a transistor layout may be suitably utilized in a multiple-port circuit configuration, and can achieve benefits in both die size and performance. Further, in an implementation that includes through substrate via (TSV) connections (sometimes referred to as "via connections" or "source vias") this reduction in size may not compromise source-to-drain pitch (SDP). As used herein, the terms "via connections" or "source vias" refer to a metal (e.g., gold or copper) connection that extends between two or more layers of a wafer and, typically, electrically links the source of a transistor on one side of a wafer through a substrate to a back metallized layer. The term "source-to-drain pitch" refers to a distance between the centers of a source contact and a drain contact for a given transistor finger.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements. These different elements may be produced utilizing current and upcoming microfabrication techniques of depositing, patterning, etching, and so forth. Accordingly, although different shading and/or hatching is utilized in the illustrations, the different elements may be formed out of the same material.

Figure 1:
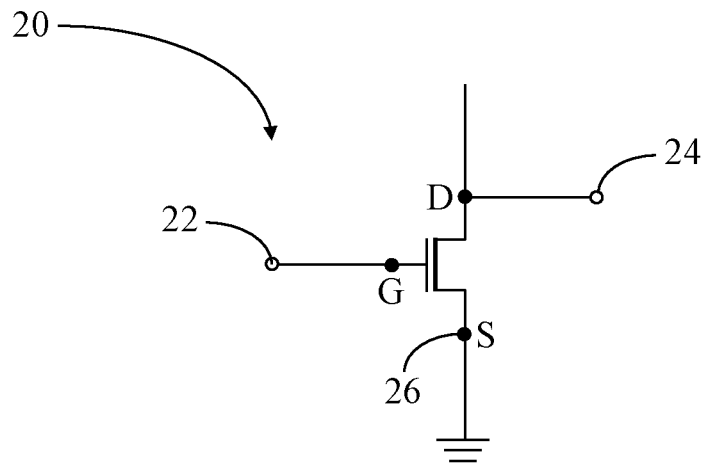
FIG. 1 shows a schematic of a common source FET device configuration.

Referring to FIG. 1, FIG. 1 shows a schematic of a common source field-effect transistor (FET) device configuration 20. In common source FET configuration 20, the gate, G, serves as an input port 22 and the drain, D, serves as an output port 24. The source, S, serves as a common connection 26 in common source configuration 20 since it is the FET lead which is grounded as shown in FIG. 1. Thus, common source configuration 20 is an example of a two-port active device in which two of the three leads of the FET serve as the input and output ports and the third lead is utilized as the common connection. For clarity of discussion, transistor layouts discussed herein have common source configuration 20. However, the following discussion applies equivalently to other two-port active semiconductor device configurations in which, for example, the gate may serve as the common connection or the drain may serve as the common connection.

Figure 2:
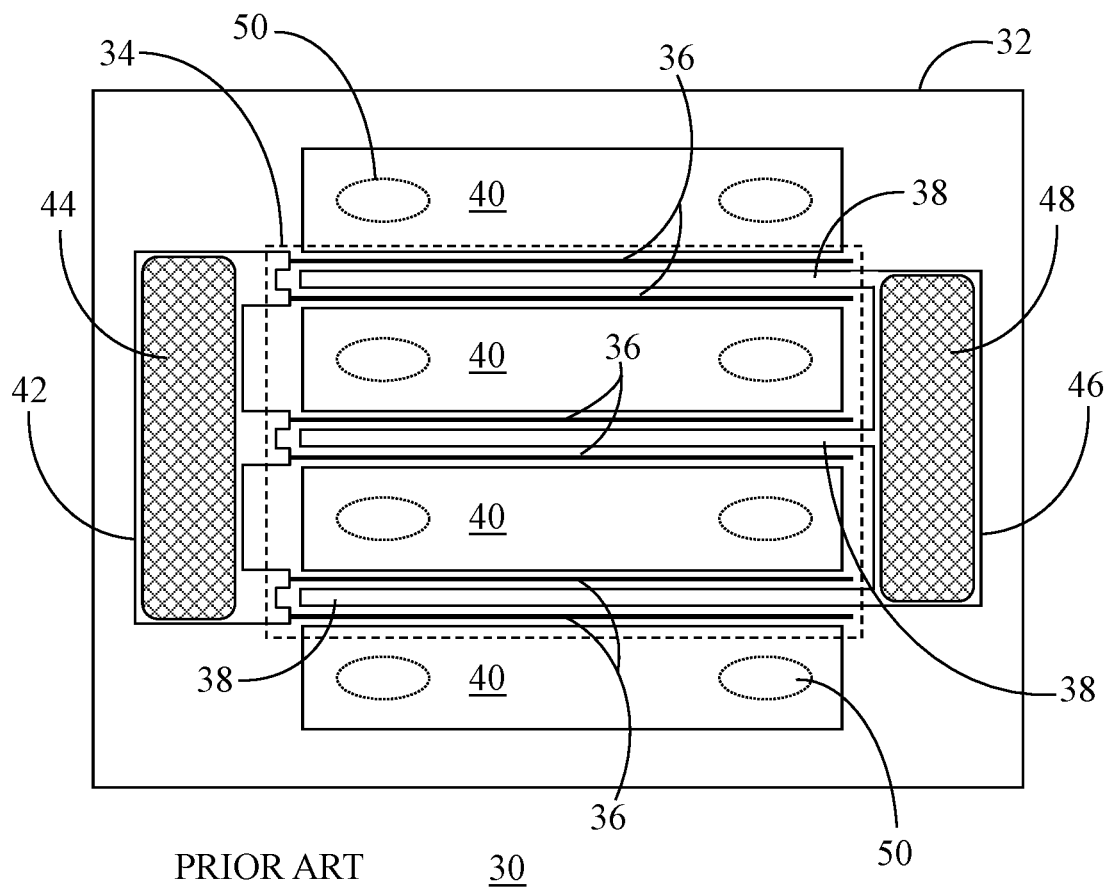
FIG. 2 shows a plan view of a layout of a prior art FET device.

FIG. 2 shows a plan view of a layout of a prior art FET device 30. FET device 30 may employ a multi-layer circuit approach configured to be disposed within a semiconductor substrate 32. FET device 30 includes an active region, generally denoted by a dashed line box 34, having sets of interdigitated gate fingers 36 (six shown), drain fingers 38 (three shown), and source fingers 40 (four shown) disposed in substrate 32 in a substantially parallel configuration. Gate fingers 36 are coupled together by a bus 42, and a bond pad, referred to herein as an input port 44, is coupled to bus 42 at an input side of active region 34. Similarly, drain fingers 38 are coupled together by another bus 46, and a bond pad, referred to herein as an output port 48, is coupled to bus 46 at an output side of active region 34. One or more via connections 50 are connected to each source finger 40. Via connections 50 extend through substrate 32 and serve to connect source fingers 40 to a ground plane (not shown) on a lower surface of substrate 32. Via connections 50 may be non-circular (e.g., oblong, elliptical) or circular and are placed in each source finger 40 adjacent to gate fingers 36. Further details of FET device 30 are not shown for clarity of illustration.

FET device 30 represents a six gate (e.g., six gate fingers 36) single transistor cell having a "slot via" layout (e.g., oblong via connections 50). In a typical transistor product, the single transistor cell of FET device 30 may be replicated side-by-side to build up a full-size transistor. In FET device 30, peak power is typically limited by the current-handling capability (width) of drain fingers 38.

High-efficiency power amplifier (PA) design is increasingly becoming an integral part of wireless communication systems. Indeed, the cellular base station market is slowly transitioning to gallium-nitride (GaN) based radio frequency (RF) products that are expected to be suitable for fifth generation (5G) communications. In many implementations that employ Doherty PA circuits or other multi-path PA circuits, the physical die area is of key concern, as power transistor products included in commercial wireless infrastructure systems have become increasingly cost-sensitive as well as area/volume/weight sensitive. With GaN technology, this is particularly important as the technology per square millimeter is significantly more expensive than that of silicon (Si) or other III—V based semiconductors. Because GaN is not manufactured on a native substrate, lattice mismatch prevents growing wafer size beyond approximately six inches in diameter. Accordingly, each GaN wafer tends to yield fewer power transistor die than are typically achievable using Si wafer technology.

It can be observed in FIG. 2 that the bond pad areas (e.g., busses 42, 46 with their respective output ports 44,48) consume a significant die area of FET device 30. In some prior art transistor configurations, the bond pad areas may consume approximately 50% of the entire die area of FET device 30. This undesirably high area consumption is contrary to the objective of reducing die cost, area, volume, and weight. Embodiments discussed herein entail a transistor layout that enables a reduction in area consumption, relative to prior art designs, without compromising the source-to-drain pitch.

Figure 3:
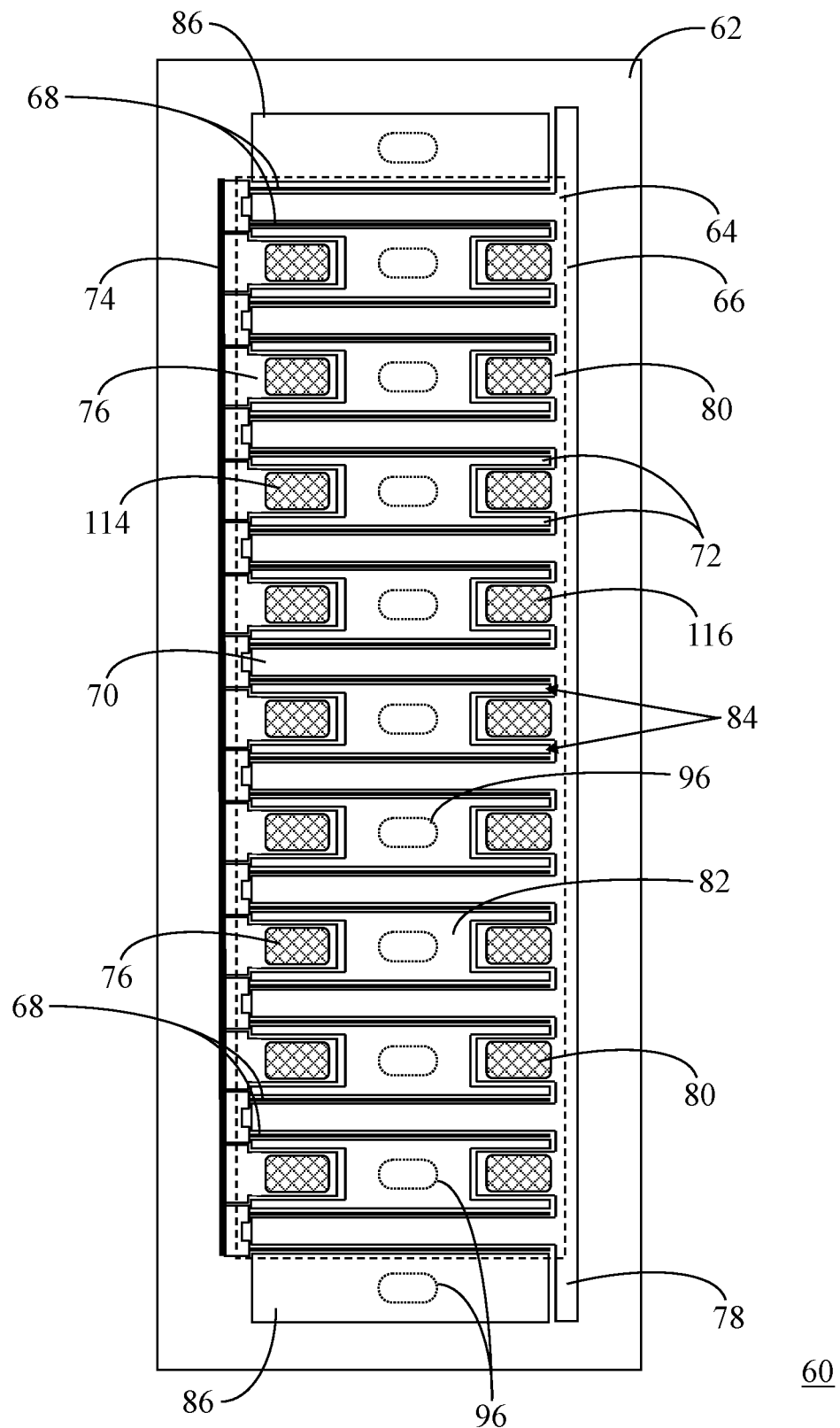
FIG. 3 shows a plan view of a layout of a FET device in accordance with an embodiment.
Figure 4:
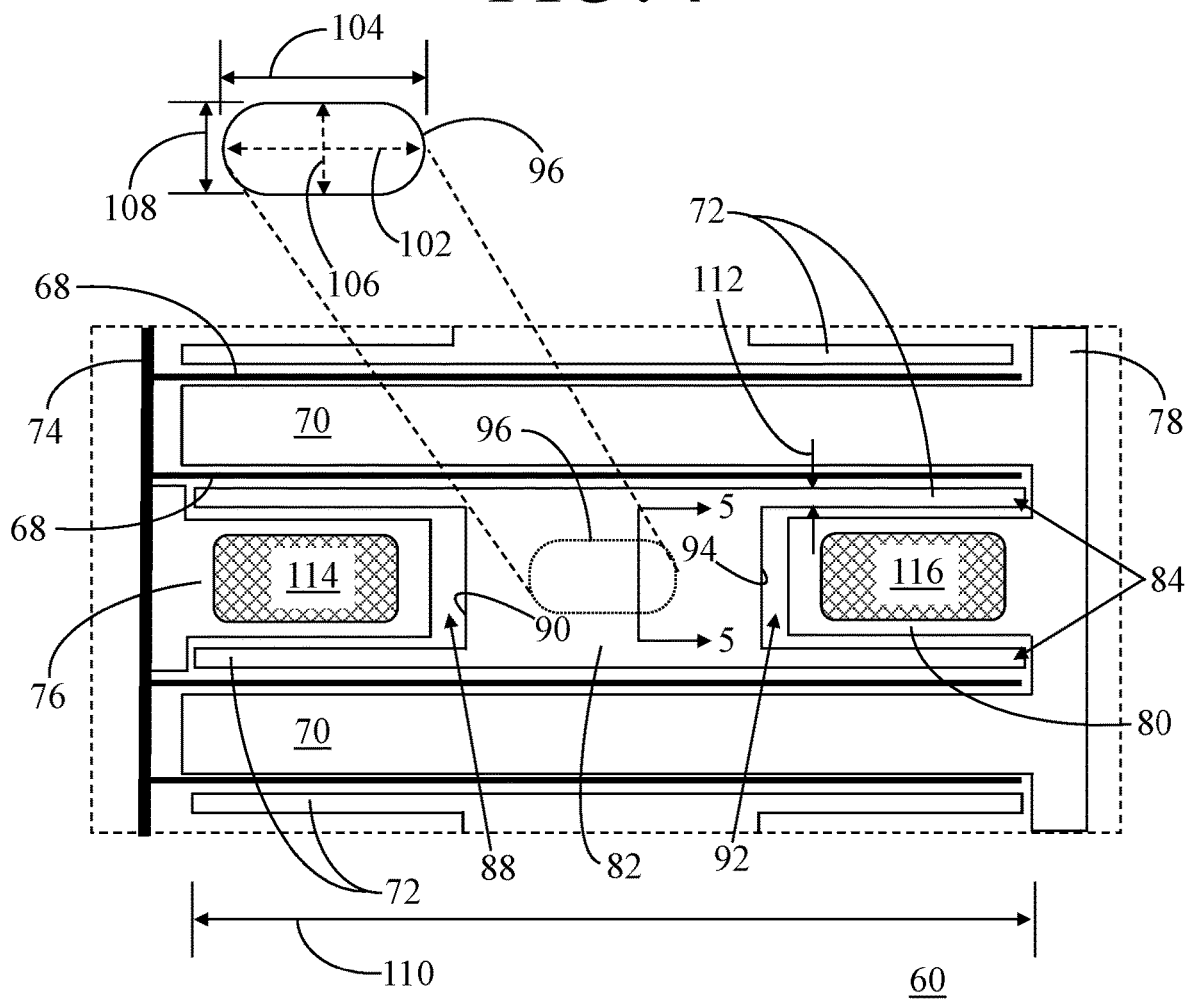
FIG. 4 shows an enlarged plan view of a portion of the FET device of FIG. 3.

Referring to FIGS. 3-4, FIG. 3 shows a plan view of a layout of a FET device 60 in accordance with an embodiment of the present invention and FIG. 4 shows an enlarged plan view of a portion of FET device 60. FET device 60 may employ a multi-layer circuit approach configured to be disposed within a semiconductor substrate 62. FET device 60 includes an active region 64 formed in substrate 62. Active region 64 is bounded by an outer periphery 66, generally represented by a dashed line box. Active region 64 includes sets of interdigitated input gate fingers 68, output drain fingers 70, and common source fingers 72 disposed within substrate 62 and oriented substantially parallel to one another.

Input gate fingers 68 are coupled together by a bus 74 and input ports 76 are coupled to bus 74 at an input side of active region 64. Thus, input ports 76 are electrically connected to input gate fingers 68 via bus 74. Similarly, output drain fingers 70 are coupled together by another bus 78 and output ports 80 are coupled to bus 78 at an output side of active region 64. Thus output ports 80 are electrically connected to output drain fingers 70 via bus 78. Common source regions 82 are electrically connected to common source fingers 72. More particularly, each common source region 82 is interposed between a pair 84 of common source fingers 72 and is electrically connected to each of common source fingers 72 of pair 84. Accordingly, each common source region 82 and its connected pair 84 of common source fingers 72 yields an approximately "H-shaped" common source structure. That is, common source region 82 spans between and electrically connects with common source fingers 72 of each pair 84. At opposing ends of active region 64 adjacent to the outermost input gate fingers 68, endmost common source fingers 86 need not be "H-shaped", but may instead be a more conventional elongated finger of sufficient width.

In accordance with an embodiment, at least one of input and output ports 76, 80 is positioned within active region 64 between input gate fingers 68, output drain fingers 70, and common source fingers 72. As best seen in the enlarged view of FIG. 4, a first gap 88 is formed at a first side 90 of common source region 82 and a second gap 92 is formed at a second side 94 of common source region 82. Input port 76 is positioned in first gap 88 and output port 80 is positioned in second gap 92. Further, common source region 82 is interposed between and electrically isolated from each of input and output ports 76, 80. Accordingly, input and output ports 76, 80 are isolated from one another by common source region 82. This configuration of input ports 76 (as the input bond pads) and output ports 80 (as the output bond pads) may be considered to be "folded into" active region 64 of FET device 60 in the space between fingers 68, 70, 72. Efficient usage of the space between fingers 68, 70, 72 can reduce the size of FET device 60 by eliminating the input and output ports (e.g., input and output ports 22, 24 and their associated bond pads 44, 48 as shown in FIG. 2) outside the active region of a transistor.

Both input and output ports 76, 80 are positioned within active region 64 of FET device 60 in the illustrative example of FIGS. 3-4. However, in alternative embodiments, only the input ports, or alternatively, only the output ports may be positioned with the active region in the space between fingers to achieve space reduction while maintaining effective isolation between the input side and the output side of the transistor device.

Figure 5:
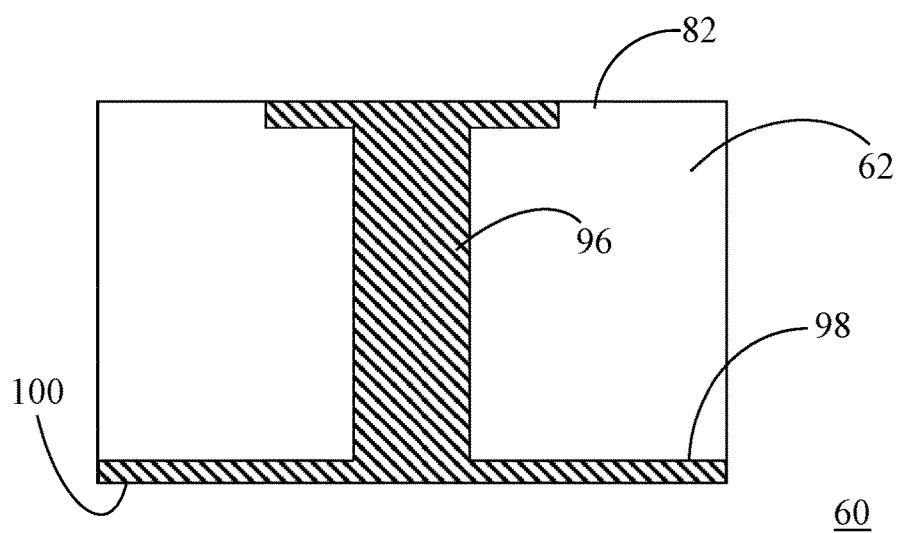
FIG. 5 shows a side sectional view of the FET device along section lines 5-5 of FIG. 4.

Referring now to FIG. 5 in connection with FIG. 4, FIG. 5 shows a side sectional view of FET device 60 along section lines 5-5 of FIG. 4. Each of common source regions 82 includes a via connection 96 that extends through substrate 62 and thus serves to connect common source fingers 72 to a common node, (e.g., a ground plane 98 of FET device 60) on a lower surface 100 of substrate 62.

Referring back to FIGS. 3-4, and as can best be seen in the enlarged view of via connection 96 in FIG. 4, in some embodiments, each via connection 96 may have a noncircular cross-section with a major axis 102 (e.g., the long axis) having a first length 104 (alternatively referred to as a major axis length) and a minor axis 106 (e.g., the short axis) having a second length 108 (alternatively referred to as a minor axis length) that is less than first length 104. In some embodiments, major axis 102 of each of via connections 96 is oriented parallel to a longitudinal dimension 110 of gate, drain, and source fingers 68, 70, 72. The particular shape and orientation of the oblong via connections 96 may largely prevent the introduction of an electromigration limitation on the output (e.g., on output drain fingers 70) while suitably fitting into the size constraints of common source regions 82. Although noncircular via connections are illustrated herein, alternative configurations may include circular via connections.

Common source fingers 72 generally extend the full length of input gate fingers 68 and output drain fingers 70, and common source fingers 72 are connected to via connections 96 at the approximately centrally positioned source region 82. As such, common source fingers 72 collect source current from the distal portions of each of common source fingers 72 and shunts the source current through via connections 96 to ground plane 98. However, a width 112 of common source fingers 72 is relatively small to accommodate the positioning of input and output ports 76, 80 in respective first and second gaps 88, 92. Current and upcoming manufacturing process capability may determine a minimum value for width 112 of common source fingers 72.

As mentioned above, input and output ports 76, 80 may include bond pads. That is, each of input ports 76 includes an input bond pad 114, denoted by cross-hatching, and each of output ports 80 includes an output bond pad 116, also denoted by cross-hatching. Each of input and output bond pads 114, 116 are configured for wire bonding. As such, input and output bond pads 114, 116 are suitably sized to accommodate a bond wire. In an example, a width of input and output bond pads 114, 116 may be at least fifty microns.

Figure 6:
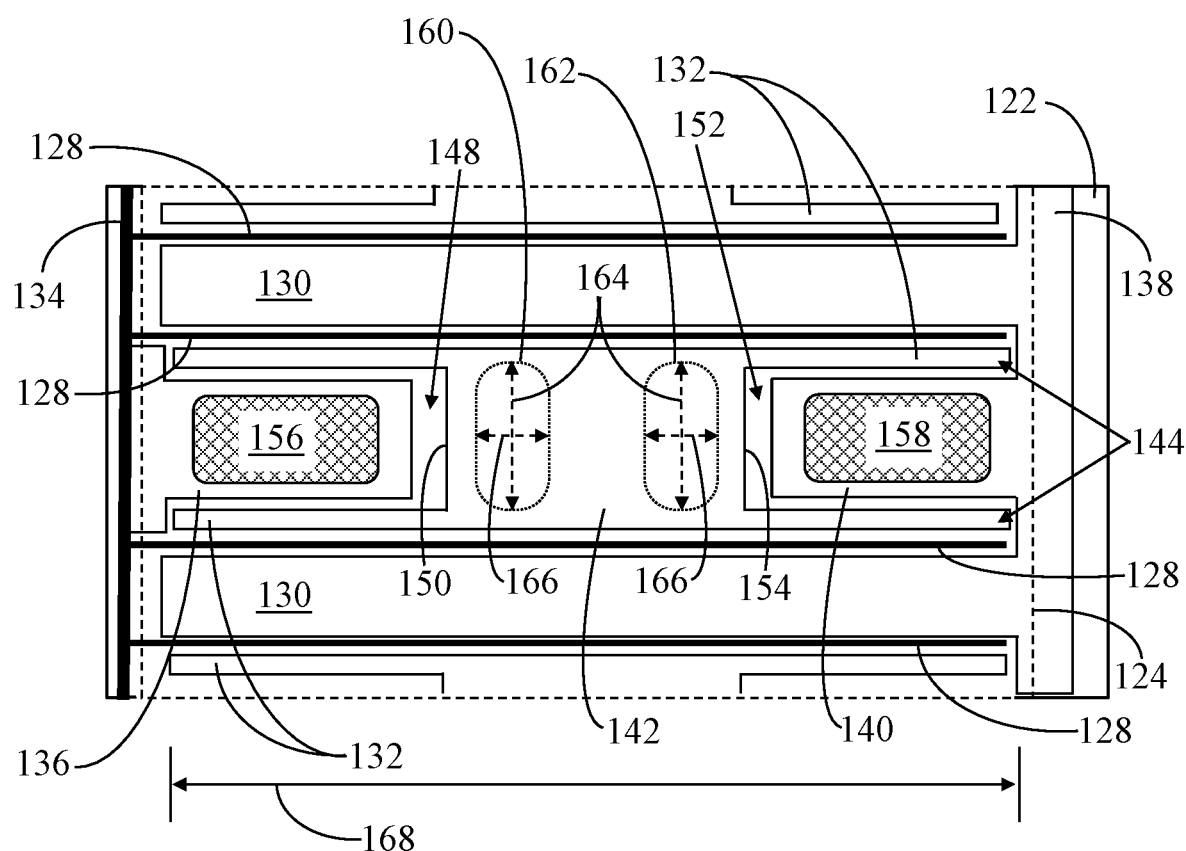
FIG. 6 shows an enlarged plan view of a FET device in accordance with another embodiment.

FIG. 6 shows an enlarged plan view of a FET device 120 in accordance with another embodiment. FET device 120 includes many of the features of FET device 60 (FIGS. 3-4). For example, FET device 120 includes a semiconductor substrate 122 with active region 124 formed in substrate 122. Active region 124 includes sets of interdigitated input gate fingers 128, output drain fingers 130, and common source fingers 132 disposed within substrate 122 and oriented substantially parallel to one another.

Input gate fingers 128 are coupled together by a bus 134 and input ports 136 are coupled to bus 134 at an input side of active region 124. Thus, input ports 136 are electrically connected to input gate fingers 128 via bus 134. Similarly, output drain fingers 130 are coupled together by another bus 138 and output ports 140 are coupled to bus 138 at an output side of active region 124. Thus, output ports 140 are electrically connected to output drain fingers 130 via bus 138. Common source regions 142 are electrically connected to common source fingers 132. More particularly, each common source region 142 is interposed between a pair 144 of common source fingers 132 and is electrically connected to each of common source fingers 132 of pair 144. Accordingly, each common source region 142 and its connected pair 144 of common source fingers 132 yields an approximately "H-shaped" common source structure. That is, common source region 142 spans between common source fingers 132 of each pair 144. A first gap 148 is formed at a first side 150 of common source region 142 and a second gap 152 is formed at a second side 154 of common source region 142. Input port 136, which includes an input bond pad 156 (denoted by cross-hatching), is positioned in first gap 148 and output port 140, which includes an output bond pad 158 (denoted by cross-hatching), is positioned in second gap 152.

In this illustrated example, each of common source regions 142 includes a two via connections 160, 162 that extend through substrate 122 and thus serve to connect common source fingers 132 to a common node (not shown) of FET device 120. In this example, each of via connections 160, 162 has a noncircular cross-section with a major axis 164 (e.g., the long axis) and a minor axis 166 (e.g., the short axis). Further, major axis 164 of each of via connections 160, 162 is oriented perpendicular to a longitudinal dimension 168 of input gate fingers 128, output gate fingers 130, and common source fingers 132.

In general, via connections 160, 162 carry the source current. Multiple via connections 160, 162 may be implemented to carry more source current, relative to the single via connection configuration of FIG. 4, and depending upon the finger design of the gate and drain fingers. For example, relatively longer gate and drain fingers 128, 130 yield greater source current and further enable additional space at source regions 142 for the multiple via connections 160, 162. Additionally, the particular shape, orientation, and pairs of the oblong via connections 160, 162 may more effectively prevent the introduction of an electromigration limitation on the output (e.g., on output drain fingers 130) relative to the single via connection configuration of FIG. 4, while also suitably fitting into the size constraints of common source regions 82. Those skilled in the art will recognize that various other configurations of via connections may be derived considering the combination of input, output, and common fingers, and the unit gate width (UGW, typically in a range of 10-15 microns).

Figure 7:
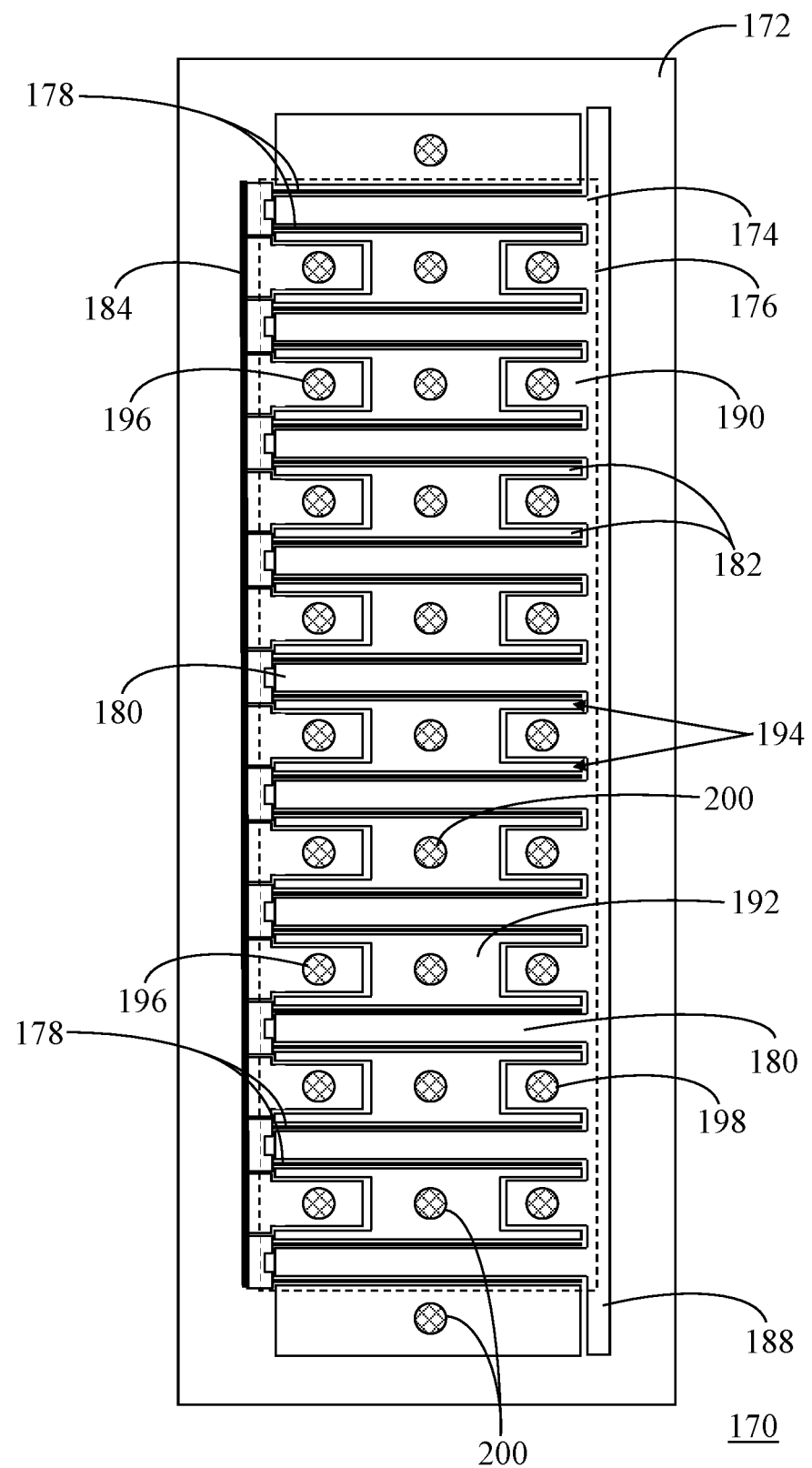
FIG. 7 shows a plan view of a layout of a FET device in accordance with another embodiment.

FIG. 7 shows a plan view of a layout of a FET device 170 in accordance with another embodiment of the present invention. FET device 170 is provided as an example layout that suitable for flip-chip interconnection methodology. That is, FET device 170 may be configured for flip-chip bonding in which solder bumps are deposited on the various transistor fingers. Like the FET devices described above, FET device 170 may employ a multi-layer circuit approach configured to be disposed within a semiconductor substrate 172. FET device 170 includes an active region 174 formed in substrate 172 that is bounded by an outer periphery 176, generally represented by a dashed line box. Active region 174 includes sets of interdigitated input gate fingers 178, output drain fingers 180, and common source fingers 182 disposed within substrate 172 and oriented substantially parallel to one another.

Like the configurations described above, input gate fingers 178 are coupled together by a bus 184 and input ports 186 are coupled to bus 184 at an input side of active region 174 so that input ports 186 are electrically connected to input gate fingers 178 via bus 184. Similarly, output drain fingers 180 are coupled together by another bus 188 and output ports 190 are to bus 188 at an output side of active region 174 so that output ports 190 are electrically connected to output drain fingers 180 via bus 188. Common source regions 192 are electrically connected to common source fingers 182. More particularly, each common source region 192 is interposed between a pair 194 of common source fingers 192 and is electrically connected to each of common source fingers 182 of pair 194. Thus, each common source region 192 and its connected pair 194 of common source fingers 182 yields an approximately "H-shaped" common source structure.

In the illustrated embodiment, each of input ports 186 includes an input pad 196 (represented by cross hatching) and each of output ports 190 includes an output pad 198 (represented by cross hatching). Each of input and output pads 196, 198 may be in the form of one or multiple solder bumps. Additionally, each of common source regions includes at least one common pad 200 (represented by cross hatching), also in the form of a solder bump, in lieu of via connections (e.g., via connections 94 of FIG. 4, via connections 160, 162 of FIG. 6). In order to mount FET device 170, FET device 170 is flipped over so that its top side faces down, and is aligned so that its input pads 196, output pads 198, and common pads 200 align with matching pads (not shown) on an external circuit (not shown), such as a printed circuit board (PCB). The solder is reflowed to complete the interconnect. In such a configuration, the front side common pads 200 can connect the source (by way of common source fingers 182 and common source regions 192) at the top side of, for example, a PCB. Since common pads 200 are implemented between input and output pads 196, 198, effective isolation can be provided between the gate and drain without the use of via connections.

Embodiments described herein entail semiconductor devices, and more specifically, a layout for a transistor device in which input and/or output ports are located within an active area of the transistor device and are positioned between input, output, and common fingers of the transistor device. The transistor layout enables the effective utilization of gaps between the transistor fingers to create the input and/or output ports for the transistor device. The input and/or output ports may include bond pads for wire bonding or solder bumps for flip-chip bonding. Accordingly, transistors layout may achieve benefits in both die size and performance. Further, implementations that include through substrate via (TSV) connections this reduction in size may not compromise source-to-drain pitch (SDP).

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A semiconductor device comprising:
an active region formed in a substrate, the active region including input fingers, output fingers, and common fingers disposed within the substrate and oriented substantially parallel to one another;
an input port electrically connected to the input fingers;
an output port electrically connected to the output fingers; and
a common region electrically connected to the common fingers, wherein at least one of the input and output ports is positioned within the active region between the input, output, and common fingers.

2. The semiconductor device of claim 1 wherein:
the common region is interposed between a pair of the common fingers such that the common fingers of the pair are spaced apart by a gap, the common region being electrically connected to each of the common fingers of the pair; and
at least one of the input and output ports is positioned in the gap.

3. The semiconductor device of claim 2 wherein:
each of the common fingers of the pair has an intermediate region at which the common region is located, the gap is a first gap at a first side of the common region, a second gap is formed at a second side of the common region;
the input port is positioned in the first gap; and
the output port is positioned in the second gap.

4. The semiconductor device of claim 3 wherein the common region is interposed between and electrically isolated from each of the input and output ports.

5. The semiconductor device of claim 1 wherein the common region includes a via connection that extends through the substrate and connects to a common node of the semiconductor device.

6. The semiconductor device of claim 5 wherein the via connection is a first via connection, and the common region further includes a second via connection that is spaced apart from the first via connection, the second via connection extending through the substrate and connecting to the common node of the semiconductor device.

7. The semiconductor device of claim 5 wherein the via connection has a noncircular cross-section with a major axis and a minor axis, the major axis having a major axis length and the minor axis having a minor axis length that is less than the major axis length, and the major axis being oriented parallel to a longitudinal dimension of the input, output, and common fingers.

8. The semiconductor device of claim 1 wherein:
the input port comprises an input bond pad; and
the output port comprises an output bond pad, each of the input and output bond pads being configured for wire bonding.

9. The semiconductor device of claim 1 wherein:
the input port comprises an input pad;
the output port comprises an output pad; and
the common region comprises a common pad, each of the input, output, and common pads being configured for flip chip bonding.

10. The semiconductor device of claim 1 wherein the input fingers are gate fingers, the output fingers are drain fingers, and the common fingers are source fingers of a transistor.

11. The semiconductor device of claim 1, wherein the input port is surrounded on three sides by the common fingers and the common region.

12. The semiconductor device of claim 1, wherein the output port is surrounded on three sides by the common fingers and the common region.

13. A semiconductor device comprising:
an active region formed in a substrate, the active region including input fingers, output fingers, and common fingers disposed within the substrate and oriented substantially parallel to one another;
an input port electrically connected to the input fingers;
an output port electrically connected to the output fingers; and
a common region interposed between a pair of the common fingers, the common region being located at an intermediate region of each of the common fingers of the pair and the common region being electrically connected to each of the common fingers of the pair, wherein the common fingers are spaced apart by a first gap at a first side of the common region, the common fingers are spaced apart by a second gap at a second side of the common region, the input port is located in the first gap within the active region and the output port is located in the second gap within the active region, and the common region is electrically isolated from each of the first and second output ports.

14. The semiconductor device of claim 13 wherein the common region includes a via connection that extends through the substrate and connects to a common node of the semiconductor device.

15. The semiconductor device of claim 14 wherein the via connection is a first via connection, and the common region further includes a second via connection that is spaced apart from the first via connection, the second via connection extending through the substrate and connecting to the common node of the semiconductor device.

16. The semiconductor device of claim 14 wherein the via connection has a noncircular cross-section with a major axis and a minor axis, the major axis having a major axis length and the minor axis having a minor axis length that is less than the major axis length, and the major axis being oriented parallel to a longitudinal dimension of the input, output, and common fingers.

17. The semiconductor device of claim 13 wherein:
the input port comprises an input bond pad; and
the output port comprises an output bond pad, each of the input and output bond pads being configured for wire bonding.

18. The semiconductor device of claim 13 wherein:
the input port comprises an input pad;
the output port comprises an output pad;
the common region comprises a common pad, each of the input, output, and common pads being configured for flip chip bonding.

19. A semiconductor device comprising:
an active region formed in a substrate, the active region including input fingers, output fingers, and common fingers disposed within the substrate and oriented substantially parallel to one another;
an input bond pad electrically connected to the input fingers;
an output bond pad electrically connected to the output fingers; and
a common region electrically connected to the common fingers, the common region including a via connection that extends through the substrate and connects to a common node of the semiconductor device, wherein at least one of the input and output bond pads is positioned within the active region between a pair of the common fingers, and each of the input and output bond pads is configured for wire bonding.

20. The semiconductor device of claim 19 wherein the common region is interposed between the pair of the common fingers, the common region being located at an intermediate region of each of the common fingers of the pair and electrically connected to each of the common fingers of the pair, wherein the common fingers are spaced apart by a first gap at a first side of the common region, the common fingers are spaced apart by a second gap at a second side of the common region, the input bond pad is located in the first gap within the active region and the output bond pad is located in the second gap within the active region.

21. The semiconductor device of claim 19 wherein the via connection is a first via connection, and the common region further includes a second via connection that is spaced apart from the first via connection, the second via connection extending through the substrate and connecting to the common node of the semiconductor device.

22. The semiconductor device of claim 19 wherein the via connection has a noncircular cross-section with a major axis and a minor axis, the major axis having a major axis length and the minor axis having a minor axis length that is less than the major axis length, and the major axis being oriented parallel to a longitudinal dimension of the input, output, and common fingers.

23. A semiconductor device comprising an active region formed in a substrate, the active region including:
a common electrode on the substrate having a central portion and at least a pair of common fingers extending along a first direction at first and second sides of the central portion of the common electrode such that:
a first gap between the pair of common fingers is disposed at a third side of the central portion of the common electrode that is adjacent to the first and second sides of the central portion of the common electrode; and
a second gap between the pair of common fingers is disposed at a fourth side of the central portion of the common electrode that is adjacent to the first and second sides of the central portion of the common electrode and opposite the third side of the central portion of the common electrode;

an input electrode having at least two input fingers on the substrate extending along the first direction on opposite sides of the common electrode; and an output electrode having at least two output fingers on the substrate extending along the first direction on opposite sides of the common electrode;

wherein a portion of one of the input electrode and the output electrode extends between the pair of common fingers within the first gap.

24. The semiconductor device of claim 23, wherein the semiconductor device is a transistor having a control terminal that is configured to provide an electrically conductive path between first and second current terminals of the transistor when a sufficient bias is provided at the control terminal; and wherein the input electrode is electrically coupled to the control terminal of the transistor, the output electrode is coupled to the first current terminal of the transistor and the common electrode is coupled to second current terminal of the transistor.

* * * * *